(12) United States Patent
Grutzediek et al.

(10) Patent No.: US 7,488,638 B2
(45) Date of Patent: Feb. 10, 2009

(54) METHOD FOR FABRICATING A VOLTAGE-STABLE PMOSFET SEMICONDUCTOR STRUCTURE

(75) Inventors: Hartmut Grutzediek, Mainz (DE); Joachim Scheerer, Mainz (DE)

(73) Assignee: PREMA Semiconductor GmbH, Mainz (DE)

( * ) Notice: Subject to any disclaimer, the term of this patent is extended or adjusted under 35 U.S.C. 154(b) by 286 days.

(21) Appl. No.: 11/297,561

(22) Filed: Dec. 8, 2005

(65) Prior Publication Data

US 2006/0121666 A1     Jun. 8, 2006

(30) Foreign Application Priority Data

Dec. 8, 2004     (EP)     ................................. 04029015

(51) Int. Cl.
*H01L 21/8238* (2006.01)
(52) U.S. Cl. ....................... 438/202; 438/235; 438/306; 438/372; 257/E21.043; 257/E21.188; 257/E21.371
(58) Field of Classification Search ................ 438/203, 438/204, 236, 335, 370, 371, 372, 373, 375, 438/377, 235; 257/E21.042, E21.043, E21.177, 257/E21.184, E21.188, E21.37, E21.372, 257/E21.373, E21.4, E21.403
See application file for complete search history.

(56) References Cited

U.S. PATENT DOCUMENTS

2003/0001206 A1     1/2003 Negoro et al. ............... 257/336

2004/0063291 A1     4/2004 Williams et al. ............ 438/309
2004/0251492 A1*   12/2004 Lin ............................. 257/335

FOREIGN PATENT DOCUMENTS

WO     WO00/19503     4/2000

* cited by examiner

*Primary Examiner*—Walter L Lindsay, Jr.
*Assistant Examiner*—Cheung Lee
(74) *Attorney, Agent, or Firm*—Heslin Rothenberg Farley & Mesiti P.C.

(57) ABSTRACT

A method for fabricating integrable PMOSFET semiconductor structures in a P-doped substrate which are distinguished by a high dielectric strength is provided. In order to fabricate the PMOSFET semiconductor structure, a mask is applied to a semiconductor substrate for the definition of a window delimited by a peripheral edge. An N-doped well is thereupon produced in the P-doped semiconductor substrate by means of high-voltage ion implantation through the window delimited by the mask, the edge zone of said N-doped well reaching as far as the surface of the semiconductor substrate. The individual regions for the source, drain and bulk of the PMOSFET semiconductor structure are then produced in the P-doped inner zone enclosed by the well. The P-doped inner zone forms the drift zone of the PMOSFET structure. Since the drift zone has the weak basic doping of the substrate, the PMOSFET has a high dielectric strength.

3 Claims, 6 Drawing Sheets

N+-type implantation

P+-type implantation

Contact hole etch

Metallization

Poly etch

N+-type implantation

P+-type implantation

Contact hole etch

METHOD FOR FABRICATING A VOLTAGE-STABLE PMOSFET SEMICONDUCTOR STRUCTURE

BACKGROUND OF THE INVENTION

The invention relates to a method for fabricating a voltage-stable P-channel MOSFET semiconductor structure proceeding from a P-doped semiconductor substrate. The invention furthermore relates to a method for fabricating a semiconductor arrangement having at least one voltage-stable P-channel MOSFET semiconductor structure and at least one N-channel MOSFET semiconductor structure proceeding from a P-doped semiconductor substrate.

PN junctions in semiconductor components are fabricated by various known methods including diffusion, epitaxy and ion implantation. A brief overview of the diverse methods for the fabrication of bipolar transistors is given in the journal article "Advances in Bipolar VLSI" by George R. Wilson in Proceedings of the IEEE, Vol. 78, No. 11, 1990, p. 1707 to 1719.

WO 00/19503 describes a method for fabricating integrable semiconductor components proceeding from a P-doped semiconductor substrate. Firstly, a mask is applied to the semiconductor substrate for the definition of a window delimited by a peripheral edge. An N-doped well is subsequently produced in the semiconductor substrate by means of high-voltage ion implantation with an energy which is high enough that a P-doped inner zone remains at the surface of the semiconductor substrate, the edge zone of the N-doped well reaching as far as the surface of the semiconductor substrate. The further N-doped and/or P-doped zones forming the structure of the semiconductor component are then produced in the P-doped inner zone of the semiconductor substrate. The method is advantageous in so far as complex epitaxy and isolation processes may be obviated.

The known N-channel MOSFETs (NMOSFET) have two N-doped regions in a semiconductor substrate that form the source and drain of the NMOSFET. Source and drain of the NMOSFET are separated by a P-doped channel region, which is also referred to as bulk. Source and drain are thus electrically insulated from one another by two depletion layers. An electrically insulated electrode forming the gate of the MOSFET extends along the surface of the semiconductor substrate from the source to the drain.

The P-doped channel region (bulk) is generally short-circuited with the source. By applying a sufficiently high positive voltage $U_{GS}$ between gate and bulk or source, it is possible to induce a so-called inversion channel, which produces an N-conducting connection between drain and source, along the surface of the semiconductor substrate. If $U_{GS}$ is reduced to 0 V, then the inversion channel disappears, and drain and source are insulated from one another again.

Since, however, the conductivity of the inversion channel is inversely proportional to the channel length, that is to say the distance between drain and source, it is endeavoured to keep the inversion channel as short as possible (U. Tietze, Ch. Schenk, "Halbleiterschaltungstechnik" ["Semiconductor circuitry"], 11th edition, Springer, Berlin, 1999, pp. 214/215).

In the case of small channel lengths, however, the bulk doping concentration must be high enough to avoid a punch-through breakdown, that is to say a PNP breakdown between drain and source.

If the generally very highly doped drain and source regions directly adjoin the bulk doping, the corresponding (avalanche) breakdown voltages of the PN junctions are relatively low. Values of significantly less than 10 V are typical. Since the entire drain-source voltage $U_{DS}$ is dropped across the depletion layer between drain and bulk, the maximum permissible $U_{DS}$ is limited by a low drain-bulk breakdown voltage.

In discrete voltage-stable MOS transistors, this problem is avoided by arranging a weakly doped drift zone between the highly doped channel region and the very highly doped drain (U. Tietze, Ch. Schenk). This not only increases the drain-bulk breakdown voltage, but also reduces the risk of punch-through between drain and source. At the same time it is possible to realize MOSFETs with small channel lengths.

In integrated voltage-stable MOS transistors, for the sake of simplicity, a weakly doped drift zone is often implanted by means of an additional implantation, which drift zone lies within the bulk doping, however, that is to say has to overcompensate for the latter. This inevitably means that the drift zone doping is higher than the bulk doping.

In discrete power MOSFETs when a very high dielectric strength is sought, the drift zone has to be doped as weakly as possible. Therefore, a very weakly doped basic material, which constitutes the doping of the drift zone, is taken as a basis and the bulk doping is implanted or diffused therein (U. Tietze, Ch. Schenk).

Assuming that the drift zone is doped very much more weakly than the channel region, the PN junction may be regarded as abrupt, that is to say that the space charge zone that forms when a reverse voltage is present extends practically exclusively into the drift zone. In order to obtain a specific dielectric strength, both the length of the drift zone and the maximum permissible doping have to be taken into consideration. The higher the breakdown voltage is intended to be, the smaller the doping concentration in the drift zone has to be.

The maximum breakdown voltage $U_{DG,BD}$ in dependence on the doping concentration in the drift zone is given by $$U_{DG,BD} = E_{BD}^2 * \in_{Si} * \in_0 /(2qN),$$

where $E_{BD}$ is the breakdown field strength, $\in_{Si}$ is the material-dependent permittivity, $\in_0$ is the permittivity of free space, q is the elementary charge and N is the doping concentration in the drift zone (S. M. Sze, "Physics of semiconductor devices", 2nd edition, Wiley & Sons, New York, 1981, p. 100, equation).

The empirical formula for the breakdown field strength at abrupt PN junctions (S. M. Sze, "Physics of semiconductor devices", p. 102)

$$E_{BD} = (4*10^5 \, V/cm^2)/(1 - \frac{1}{3}*\log_{10}(N/10^{16} \, cm^{-3}))$$

yields the maximum achievable drain-gate breakdown voltage in dependence on the doping concentration.

It is apparent that a lowest possible doping concentration is to be sought for the drift zone in order to achieve the highest possible dielectric strengths. In practice, involving readily reproducible components, the basic doping of the semiconductor substrate (wafer) is the lowest available doping concentration.

The integration of a voltage-stable P-channel MOSFET (PMOSFET) on a P-doped wafer presupposes an N-doped well that insulates the drain region from the substrate. Furthermore, a weakly P-doped region for the drift zone has to be produced within the N-type well. The bulk doping and the source/drain doping are subsequently introduced into this double well. There are various possibilities suitable for producing the double well.

On the basis of the known methods for fabricating semiconductor components, it is obvious, in order to obtain high dielectric strengths, to provide a weakly P-doped epitaxial layer on a highly doped N-type layer (buried layer). However, this method is technically demanding and cost-intensive on account of the epitaxy step and the lateral isolation required. Furthermore, the method is lengthy on account of the long diffusion processes. A further disadvantage resides in the poor utilization of area, leading to large components.

If less stringent requirements are made of the dielectric strength, it is possible to resort to the known diffusion processes for producing a P-doped region in an N-doped well. In this case, however, a multiple overcompensation of N-type and P-type dopings arises at the surface in the drift region, as a result of which the minimum doping level of the drift zone is limited for reasons of reproducibility. Consequently, this method is not appropriate for voltage-stable MOSFET transistors.

BRIEF SUMMARY OF THE INVENTION

The invention is based on the object of specifying a simplified method that permits the cost-effective fabrication of voltage-stable P-channel MOSFET semiconductor structures proceeding from a P-doped semiconductor substrate with comparatively small device dimensions. This object is achieved according to the invention by means of the features of Patent Claim 1.

A further object of the invention is to specify a method that permits the fabrication in a simple manner of a semiconductor arrangement comprising both at least one P-channel and at least one N-channel MOSFET semiconductor structure. This object is achieved by means of the features of Patent Claim 10.

The method according to the invention is based on producing an N-doped well in a P-doped semiconductor substrate by means of high-voltage ion implantation, the energy of the ion implantation being dimensioned in such a way that a P-doped inner zone remains at the surface of the semiconductor substrate and the edge zone of the N-doped well reaches as far as the surface of the semiconductor substrate.

The inventors have recognized that the P-doped inner zone of the well fabricated according to the above method is outstandingly suitable as drift zone for a P-channel MOSFET. This can be attributed to the fact that the concentration of the doping of the inner zone corresponds to the concentration of the basic doping of the semiconductor substrate, that is to say the lowest concentration which is still reliably reproducible. The dielectric strength of the P-MOSFET fabricated by the method according to the invention is limited only by the basic doping of the semiconductor substrate and the depth of the well.

The crucial advantage of the method according to the invention is that a very high dielectric strength is obtained by means of a comparatively simple process. The simplicity of the process is manifested in the fact that the well, the drift region and the lateral isolation of the well can be produced by means of a just a single lithography and ion implantation with just a single energy.

It has been shown that the high-voltage ion implantation can produce deep wells that permit high vertical breakdown voltages between drain and well. The high dielectric strength is achieved on the one hand by means of the high ion energy and on the other hand by means of the weak basic doping of the wafer, which is utilized as doping of the drift zone.

In a P-channel MOSFET, the N-doped channel region and the N-doped well are separated vertically—if at all—only by a weakly P-doped zone. In order to reduce the risk of a punch-through breakdown, the channel region and the well can be short-circuited. In order to increase the dielectric strength between the channel region and the drain, it is merely necessary to choose a suitable distance between the drain and the channel region, on the one hand, and the edge of the well, on the other hand. Furthermore, the known measures should be implemented for suppressing a depletion layer breakdown at the surface of the semiconductor substrate.

Once the initial structure created by means of the high-voltage ion implantation has been fabricated, the P-channel MOSFET semiconductor structures can be produced by means of the known process steps. The individual zones are preferably produced by means of ion implantations. The regions in which ions are implanted can be defined by means of the known masking processes. The mask material may comprise photoresist, metal, glass or other materials. The structure of the mask-defined zones that are intended to be doped is preferably created by lithographic methods. Combinations of lithographies and etches are also possible.

A particular advantage of the method according to the invention for fabricating voltage-stable P-channel MOSFET semiconductor structures in P-doped semiconductor substrates is that a semiconductor arrangement having both a P-channel MOSFET semiconductor structure and an N-channel MOSFET semiconductor structure can be created by means of only one high-voltage implantation. In this case, the P-channel MOSFET structure is fabricated according to the above method. In order to produce the N-channel MOSFET structure, according to the invention the width of the window defined by the mask applied to the semiconductor substrate is in contrast made so narrow that the edge zones of the well that reach as far as the surface of the semiconductor substrate meet at the substrate surface, so that a corresponding inner zone does not remain at the surface of the substrate. This "filled" well can then advantageously be utilized as drift zone for the N-channel MOSFET structure. Various embodiments in which one or more wells run parallel or at right angles to the channel region are possible in this case.

BRIEF SUMMARY OF THE DRAWINGS

A number of exemplary embodiments of the method according to the invention for fabricating MOSFET semiconductor structures are explained in more detail below with reference to the drawings.

In the figures.

DETAILED DESCRIPTION

Figure 1A:
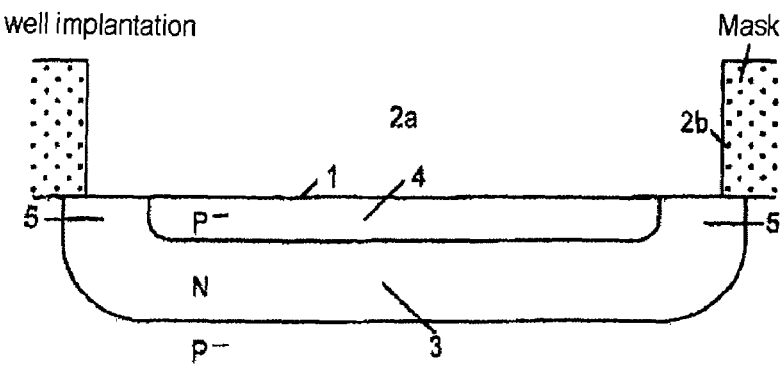
FIGS. 1a to 1h show the individual method steps for fabricating a PMOSFET semiconductor structure in a P-doped semiconductor substrate.

In order to fabricate a P-channel MOSFET semiconductor structure (PMOSFET), firstly the initial structure shown in FIG. 1a is created. For this purpose, a mask 2 is applied to a weakly P-doped semiconductor substrate 1 (wafer), said mask having a window 2a delimited by a peripheral edge 2b. A wafer made of weakly P-doped monocrystalline silicon having a resistivity of e.g. 6 Ω cm is preferably used for the basic material. Further suitable semiconductor materials are e.g. GaAs and SiC with the dopants suitable for these substances.

The mask material may comprise photoresist, metal, glass or else other materials. The structure is preferably created by means of photolithographic methods.

The creation of the mask is followed by a doping, preferably a high-voltage implantation, in order to create an N-doped well 3 in the semiconductor substrate 1. In this case, the implantation energy has a magnitude such that a P-doped inner zone still remains above the well 3 in the semiconductor substrate 1 ("non-filled well"). By way of example, this condition is met given 6 MeV phosphorus ions and a dose of e.g. $2\times10^{13}$ ions/cm$^2$, despite the backscattered phosphorus ions, if the semiconductor substrate has a resistivity of 6 Ω cm. The non-filled well can be obtained by variation of ion type, ion energy, implantation dose and also substrate doping. What is crucial is that the surface doping concentration of the well is significantly less than the concentration of the substrate doping. A low surface doping concentration of the well can be achieved by means of a high ion energy (or a high range of the ions) and/or a low dose. A high substrate doping likewise makes it easier to meet the condition for producing a non-filled well.

Since the ions are scattered at a perpendicular edge of a mask window or decelerated to different extents at obliquely running edges, a well 3 with an edge zone 5 drawn upwards is formed, which reaches as far as the surface of the semiconductor substrate 1 and encloses the remaining P$^-$-doped inner zone 4 at the surface of the semiconductor substrate. Consequently, the P$^-$-doped inner zone 4 is insulated from the substrate volume. For the formation of the edge zone it is unimportant whether the edge 2b of the mask window is shaped in perpendicular fashion or in a manner overhanging obliquely outwards or obliquely inwards.

The minimum thickness of the mask 2 is defined by the maximum range of the ions in the mask material. Masks of greater thickness widen the scattering regions at the well edge, thereby making it more difficult to fabricate small wells.

Proceeding from the semiconductor structure shown in FIG. 1a, the PMOSFET semiconductor structure is created by means of the steps described below (FIGS. 1b to 1h). The process sequence described below is, however, only one exemplary embodiment for the fabrication of a PMOSFET structure. Therefore, it is also possible to carry out method steps other than those described for creating the structure. However, the method according to the invention always presupposes the initial structure described with reference to FIG. 1.

Since the individual method steps for fabricating differently doped regions in a semiconductor substrate are known as such to the person skilled in the art, for example the fabrication of masks and patterning by etching, only the essential method steps for fabricating the PMOSFET semiconductor structure will be described.

Figure 2:
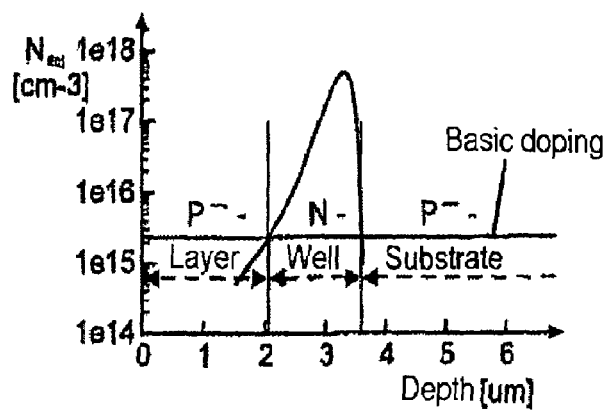
FIG. 2 shows the doping profile of the well produced by means of high-voltage ion implantation in the semiconductor substrate from FIGS. 1a to 1h, FIGS. 3a to 3h show the individual method steps for fabricating an NMOSFET semiconductor structure in a P-doped semiconductor substrate.

FIG. 2 shows the doping profile of the well produced by means of high-voltage ion implantation with an energy of 6 MeV, the implantation dose being $2\times10^{13}$/cm$^2$ phosphorus ions, and the P-doped substrate having a resistivity of 6 Ω cm. It can clearly be discerned that the basic doping of the semiconductor substrate remains in the inner zone enclosed by the well, that is to say the layer in the region of 0 to 2 μm.

Figure 1B:
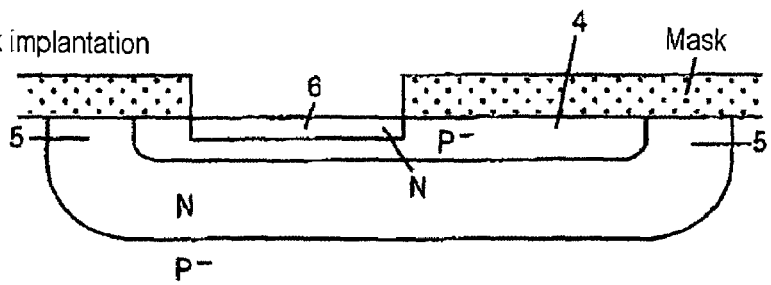
Figure 1C:
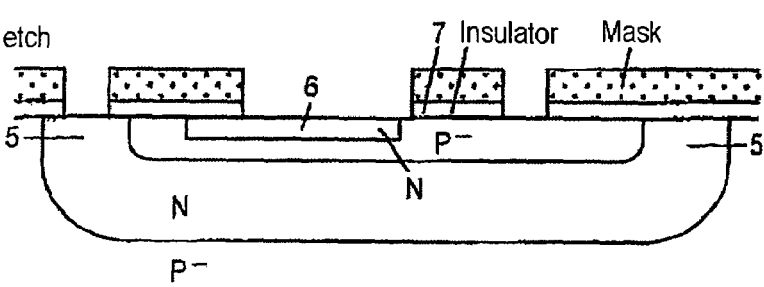

After the initial structure has been fabricated, a new mask is applied to the semiconductor substrate 1 and patterned. An N-doped channel region 6 is produced in the P-doped inner zone 4 by means of ion implantation (FIG. 1b). After removal of the mask, an insulator layer 7 is deposited on the semiconductor substrate 1. After application of a further mask, the insulator layer 7 is patterned by means of etching (FIG. 1c).

Figure 1D:
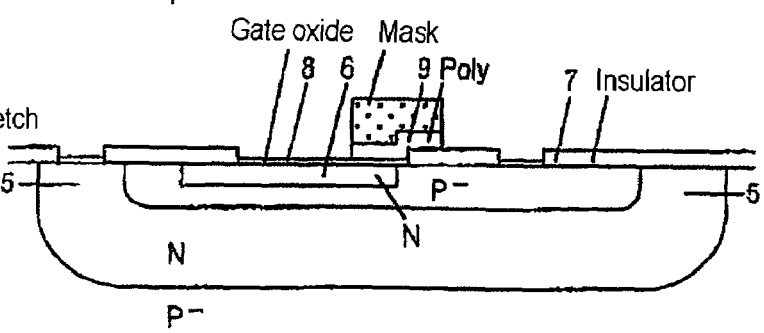

A gate oxide layer 8 is produced on the N-doped channel region 6, a gate electrode 9 made of polysilicon being deposited onto said gate oxide layer and patterned. The gate insulating layer also arises in other openings in the insulator layer. In order to protect the edges of the gate oxide layer from the subsequent high-dose implantations and in order to reduce the parasitic gate-source and gate-drain capacitances, generally a so-called spacer is also produced along the gate edges. For the sake of better clarity, however, said spacer, which is known as such, is not shown here (FIG. 1d).

Figure 1E:
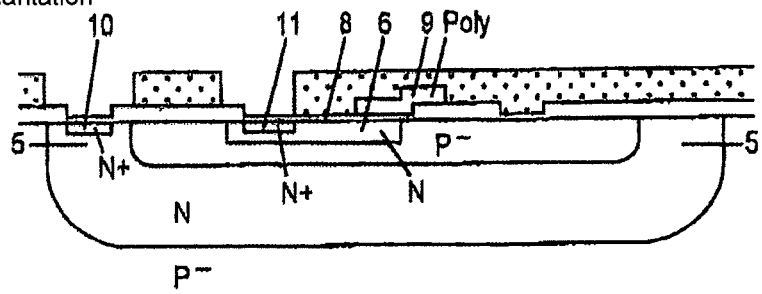
Figure 1F:
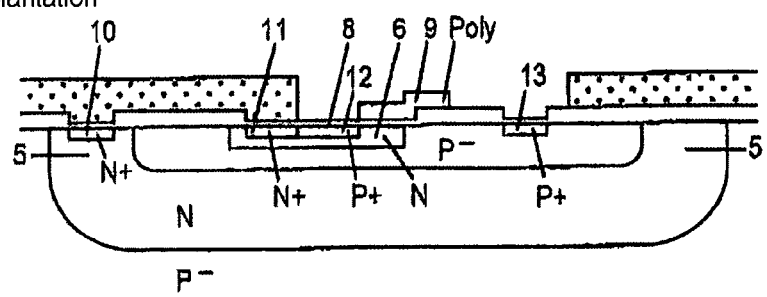

N$^+$-doped transition zones 10, 11 for the connection of the well and of the channel region are produced by means of ion implantation in that region of the N-doped channel region 6 which adjoins the gate electrode 9 and in the upwardly drawn edge region 5 of the N-doped well 3 (FIG. 1e). This is followed by a further implantation step for producing a P$^+$-doped source region 12 in that region of the N-doped channel region 6 which adjoins the gate electrode 9 and for producing a P$^+$-doped drain region 13 in that region of the P-doped inner zone 4 which adjoins the N-doped channel region (FIG. 1f).

Figure 1G:
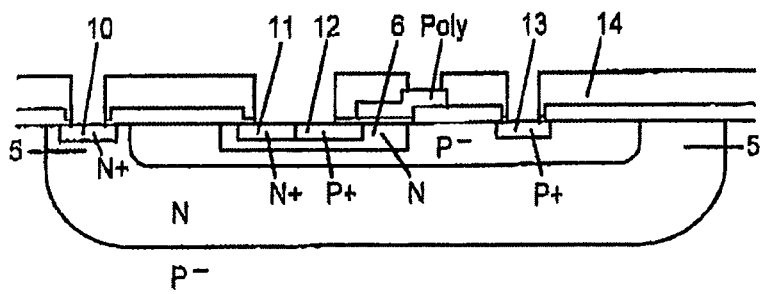
Figure 1H:
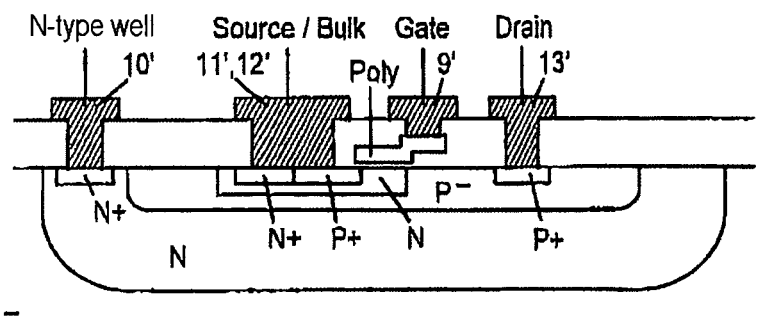

This is followed by the deposition of a second insulator 14 and a heat treatment step for annealing the crystal damage produced during the implantations and for activating the dopants. The contact holes for the connections of the PMOSFET semiconductor structure are thereupon etched (FIG. 1g). The connection contacts for the drain connection 13', the gate connection 9', the source/bulk connection 11' and 12' and also the connection 10' for the N-doped well 3 are subsequently fashioned for example by means of titanium silicide formation. The source/bulk connection 11' and 12' produces a short circuit between the P$^+$-doped source region 12 and the N-doped channel region 6 (bulk). The formation of the metallization completes the PMOSFET semiconductor structure (FIG. 1h).

In the PMOSFET semiconductor structure, the P$^-$-doped inner zone 4 lies in the region between gate and drain 9, 13, and the P$^-$-doped inner zone thus forms the drift zone of the PMOSFET. Since the doping of the drift zone corresponds to the very weak basic doping of the semiconductor substrate, the MOSFET has a high dielectric strength. Assuming a sufficient length of the drift zone and also sufficient measures for suppressing surface breakdowns, the maximum drain-source voltage $U_{DS}$ is limited only by the breakdown voltage between drain connection and N-type well.

The N-conducting bulk doping need not necessarily be insulated (vertically) from the N-type well since it is connected thereto anyway. Accordingly, it may readily merge into the well doping in the depth.

The method according to the invention is distinguished by the fact that a PMOSFET semiconductor structure having a high dielectric strength can be created by means of simple method steps. For the case where a semiconductor arrangement comprising both a PMOSFET semiconductor structure and an NMOSFET semiconductor structure is to be fabricated on a semiconductor substrate, the semiconductor arrangement can be fabricated in a simple manner by means of the steps described below.

Firstly, the PMOSFET semiconductor structure is fabricated on the semiconductor substrate by means of the method steps described with reference to FIGS. 1a to 1h. The NMOSFET semiconductor structure is thereupon fabricated on the same substrate alongside the PMOSFET structure by means of the subsequent steps.

While an N-doped well enclosing a P-doped inner zone is created by means of high-voltage ion implantation in order to fabricate the PMOSFET structure, an N-doped well that reaches as far as the surface of the semiconductor substrate is created in order to fabricate the NMOSFET semiconductor structure. Since said well serves as drift zone in the case of the NMOSFET semiconductor structure, a further implantation step for fabricating a zone of this type can be omitted. The method is thereby simplified.

For fabricating the "filled well" it is possible to use the same method steps as for fabricating the "non-filled well". The only difference is that the window 2a of the mask for the high-voltage ion implantation is made so narrow that the drawn-up scattering regions along the well edges meet in the centre of the well. If the thickness of the mask is increased, the scattering regions are widened, which facilitates the fabrication of the NMOSFET semiconductor structure.

FIGS. 3a to 3h show the individual method steps for fabricating the NMOSFET semiconductor structure. Apart from a further implantation for the P-doped bulk region, the NMOSFET semiconductor structure is fabricated by means of the same process steps as the PMOSFET semiconductor structure. FIGS. 3a to 3h show the method steps using the example of a non-isolated NMOSFET whose bulk is at substrate potential. This NMOSFET has an N-doped well arranged parallel to the gate.

Figure 3A:
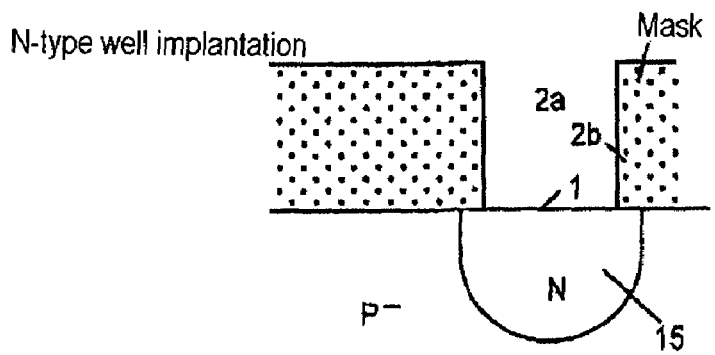
Figure 3B:
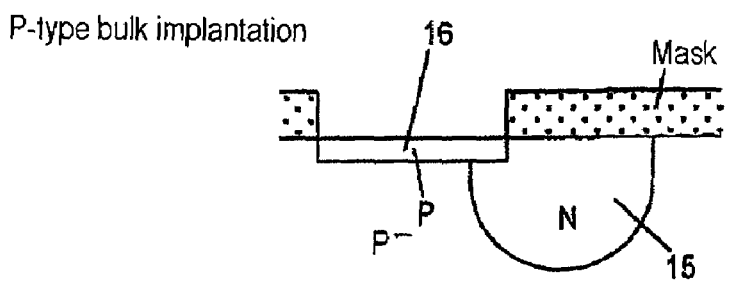

Firstly, a "filled" N-doped well 15 is produced in the weakly P⁻-doped semiconductor substrate 1 by means of high-voltage ion implantation through a mask 2 having a narrow window 2a (FIG. 3a). The N-doped well forms the drift zone for the NMOSFET. A P-doped channel region 16 is thereupon produced in the semiconductor substrate 1, said channel region extending right into the N-doped drift zone 15 (FIG. 3b). The same process steps as during the fabrication of the PMOSFET semiconductor structure then follow, the corresponding doping regions in each case having the inverted conduction type.

Figure 3C:
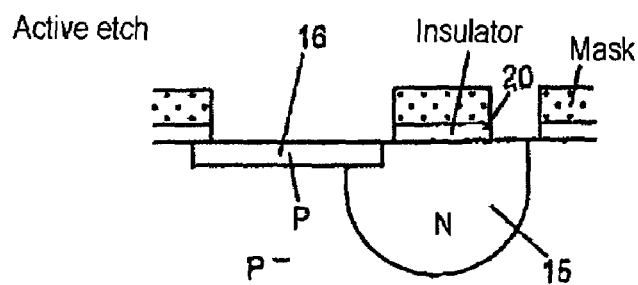
Figure 3D:
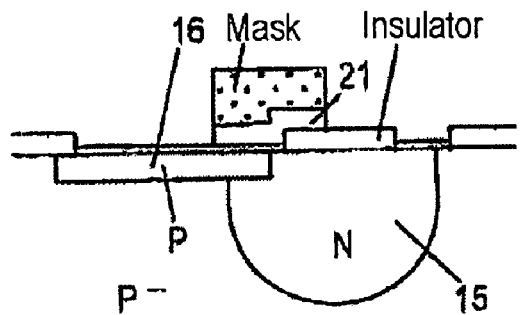
Figure 3E:
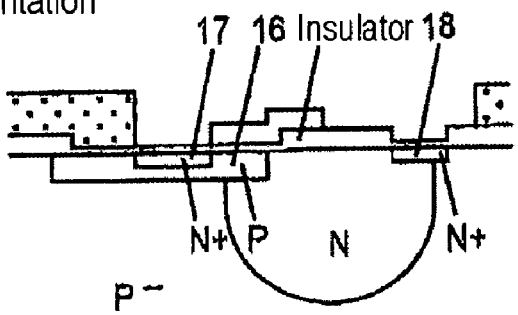
Figure 3F:
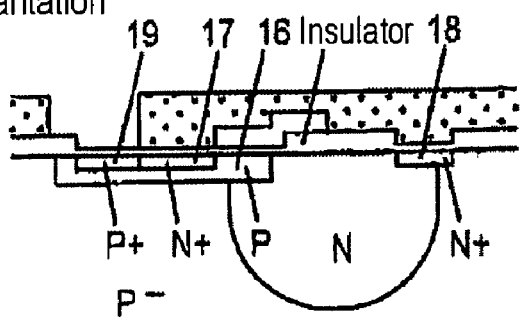
Figure 3G:
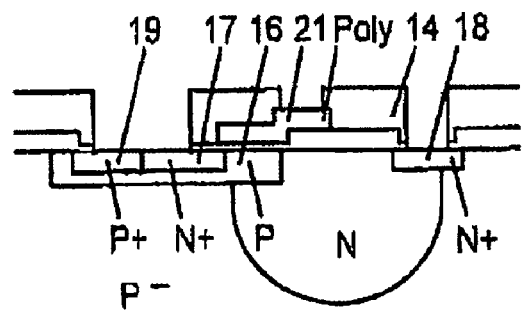
Figure 3H:
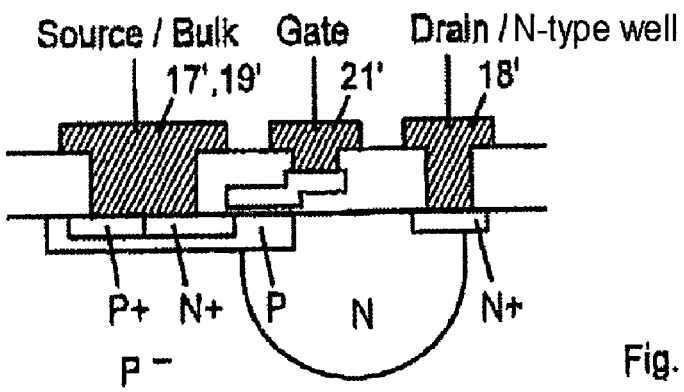

An insulator layer 20 is deposited on the semiconductor substrate 1 and patterned (FIG. 3c). There follow the fabrication of the gate oxide layer and also the deposition and patterning of the gate electrode 21 made of polysilicon for the gate connection 21' (FIG. 3d). This is followed by the steps for producing an N⁺-doped region 17 and P⁺-doped region 19 in the P-doped channel region 16 for the common source/bulk connection 17' and 19' and also an N⁺-doped region 18 in the edge region of the drift zone 15 for the drain connection 18', which simultaneously forms the well connection (FIGS. 3f to 3h).

The NMOSFET semiconductor structure is located directly in the semiconductor substrate, the bulk region being connected to the substrate. No problems arise as long as the source is permanently at the potential of the substrate (earth). If the source potential is raised, however, then a so-called rear-side control that shifts the threshold voltage of the MOSFET commences as a result of the difference voltage between source and bulk. This can be avoided, however, as is described in the following paragraph.

Figure 4A:
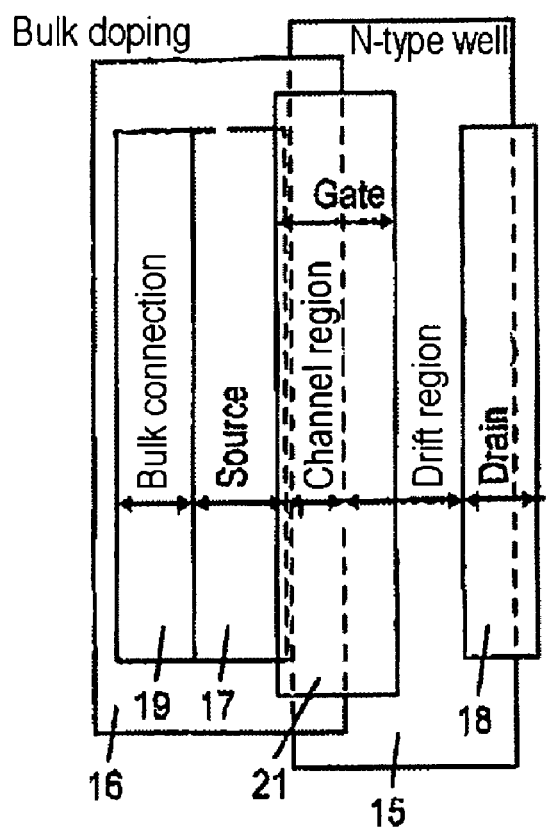
FIGS. 4a to 4d show various exemplary embodiments of an NMOSFET semiconductor structure with channel regions arranged differently.

FIG. 4a shows the arrangement of the individual zones of the semiconductor substrate in plan view in the case of the semiconductor structure described with reference to FIGS. 3a to 3h, the N-type well 15 of which runs parallel to the gate 21, that is to say transversely with respect to the current flow direction. Identical reference symbols are used for the mutually corresponding regions of the semiconductor substrate. Since the width of the N-type well 15 is limited by the width of the scattering regions, the N-type well should be centred as far as possible with respect to the drift zone. The latter is defined by the drain-side edge of the channel doping and the beginning of the highly doped drain region. In contrast to a flat drift zone, the N-type well as drift zone affords the possibility of the bulk doping also being located completely in the N-type well in conjunction with a space-saving layout and a lack of excessively high requirements made of the dielectric strength. It is thus possible to insulate bulk and source from the substrate.

Figure 4B:
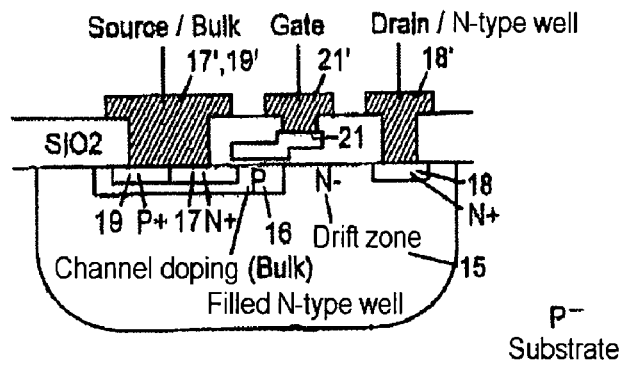

FIG. 4b shows an alternative embodiment of the NMOSFET semiconductor structure in a simplified schematic illustration, in which three parallel N-type wells 15 run perpendicular to the gate 21. The mutually corresponding regions of the semiconductor substrate are again designated by identical reference symbols. The advantages over the embodiment with the well running parallel to the gate reside in the freedom of being able to extend the drift zone as far as desired and at the same time of obtaining complete insulation with respect to the substrate.

Figure 4C:
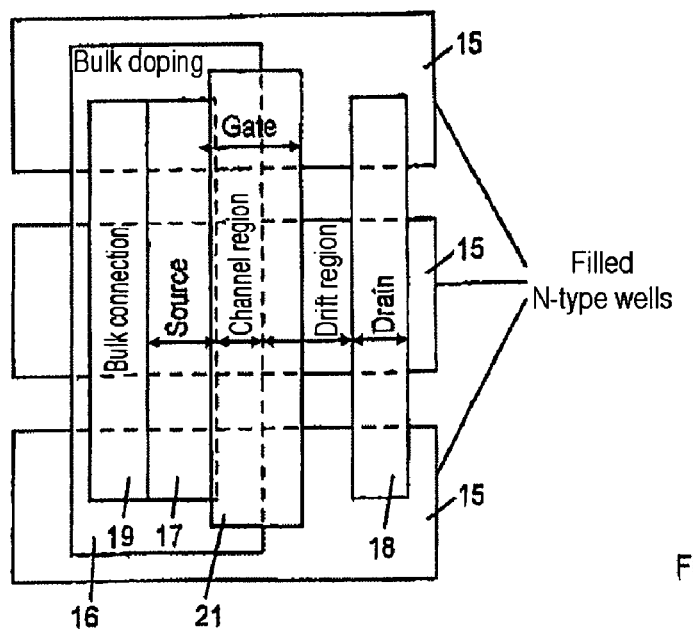
Figure 4D:
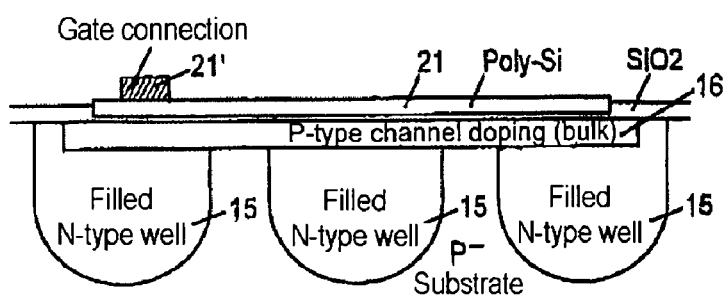

For larger channel widths it is also possible for a plurality of wells to be arranged parallel to one another. FIGS. 4c and 4d show in cross section and in plan view an embodiment in which three N-type wells 15 are oriented perpendicular to the gate. The regions between the wells are then either likewise continuously N-doped as a result of scattering under the mask edge or otherwise remain ineffective for the MOSFET because the drift zone is absent, but in the latter case the bulk region is conductively connected to the substrate.

The PMOSFET and NMOSFET semiconductor structures described in the exemplary embodiments proceed from a P-doped semiconductor substrate. However, it is also possible, in principle, to proceed from an N-doped semiconductor substrate. In this case, all the implantations are replaced by the complementary species, that is to say N-type implantations by P-type implantations or vice versa.

The invention claimed is:

1. Method for fabricating a voltage-stable PMOSFET semiconductor structure proceeding from a P-doped semiconductor substrate, having the following steps of:
  applying a mask to the P-doped semiconductor substrate for definition of a window delimited by a peripheral edge,
  producing an N-doped well in the P-doped semiconductor substrate by means of high-voltage ion implantation, energy of the ion implantation being dimensioned in such a way that a P-doped inner zone remains at a surface of the semiconductor substrate and an edge zone of the N-doped well reaches as far as the surface of the semiconductor substrate, and
  producing a P-doped source region, a P-doped drain region and an N-doped channel region between the P-doped source region and the P-doped drain region in the remaining P-doped inner zone of the N-doped well, the source region, the drain region and the channel region being arranged in such a way that the remaining P-doped inner zone of the well remains as a drift zone between the channel region and the drain region,
  wherein after production of the N-doped well, the N-doped channel region is produced in the P-doped inner zone,
  wherein an insulator layer is applied to the N-doped channel region and a gate electrode is applied on the insulator layer,
  wherein a gate connection is applied to the gate electrode,
  wherein a source/bulk connection is applied to the P-doped source region and to a region of the N-doped channel region which adjoins the P-doped source region, and wherein an N+-doped transition zone is produced prior to the application of the source/bulk connection in the region of the N-doped channel region which adjoins the P-doped source region.

2. Method according to claim 1, wherein a drain connection is applied to the P-doped drain region.

3. Method for fabricating a semiconductor arrangement having at least one voltage-stable PMOSFET semiconductor structure and at least one NMOSFET semiconductor structure proceeding from a P-doped semiconductor substrate, having the following steps of:

fabricating the at least one PMOSFET semiconductor structure by the method according to claim 1, and fabricating the at least one NMOSFET semiconductor structure by the following steps of:

applying a mask to the P-doped semiconductor substrate for definition of a window delimited by a peripheral edge, producing an N-doped well in the P-doped semiconductor substrate by means of high-voltage ion implantation, energy of the ion implantation and width of the window being dimensioned in such a way that edge zones of the N-doped well that reach as far as the surface of the semiconductor substrate meet at the surface of the semiconductor substrate, so that no P-doped inner zone remains at the surface of the semiconductor substrate, and producing an N-doped source region, an N-doped drain region and a P-doped channel region in the P-doped semiconductor substrate, the source region, the drain region and the channel region being arranged in such a way that the N-doped well remains as a drift zone between the channel region and the drain region.

* * * * *